(12) United States Patent
Sorsby

(10) Patent No.: US 8,576,945 B1
(45) Date of Patent: Nov. 5, 2013

(54) METHOD OF AND APPARATUS FOR SIGNAL AMPLIFICATION

(75) Inventor: William B. Sorsby, Cedar Rapids, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 376 days.

(21) Appl. No.: 12/955,716

(22) Filed: Nov. 29, 2010

(51) Int. Cl.
*H04L 25/49* (2006.01)

(52) U.S. Cl.
USPC ........... 375/297; 375/296; 375/295; 330/149; 330/151

(58) Field of Classification Search
USPC .................. 375/297, 296, 295; 330/149, 151
See application file for complete search history.

(56) References Cited

U.S. PATENT DOCUMENTS

| | | | | |
|---|---|---|---|---|
| 5,760,646 A | * | 6/1998 | Belcher et al. | 330/149 |
| 6,504,428 B2 | * | 1/2003 | Cova et al. | 330/52 |
| 6,683,495 B2 | * | 1/2004 | Johnson et al. | 330/52 |
| 7,116,167 B2 | * | 10/2006 | Ahn | 330/151 |
| 7,126,999 B2 | | 10/2006 | Dent | |
| 7,391,261 B2 | | 6/2008 | Dittmer | |
| 7,940,106 B2 | * | 5/2011 | Laske et al. | 327/309 |
| 8,233,850 B1 | * | 7/2012 | Sorsby | 455/114.3 |
| 2002/0047746 A1 | * | 4/2002 | Dartois | 330/151 |
| 2008/0089439 A1 | * | 4/2008 | Piirainen | 375/296 |

OTHER PUBLICATIONS

U.S. Appl. No. 12/286,021, filed Sep. 26, 2008, Sorsby et al.

* cited by examiner

*Primary Examiner* — Kenneth Lam
(74) *Attorney, Agent, or Firm* — Donna P. Suchy; Daniel M. Barbieri

(57) ABSTRACT

A system for and method of amplifying a modulated input signal can include separating the input signal into a first amplitude component signal and a first amplitude composite signal (e.g., an amplitude only component signal). The method further includes subtracting the first amplitude composite signal from the input signal to provide a difference signal. The method also includes amplifying the difference signal asymmetrically with respect to the first amplitude composite signal. The method can also include adding the difference signal and the first amplitude composite signal after asymmetric amplification. The power amplifier supply voltage can be powered as a function of the first amplitude component signal. The mathematical operations can be performed in the digital domain.

23 Claims, 14 Drawing Sheets

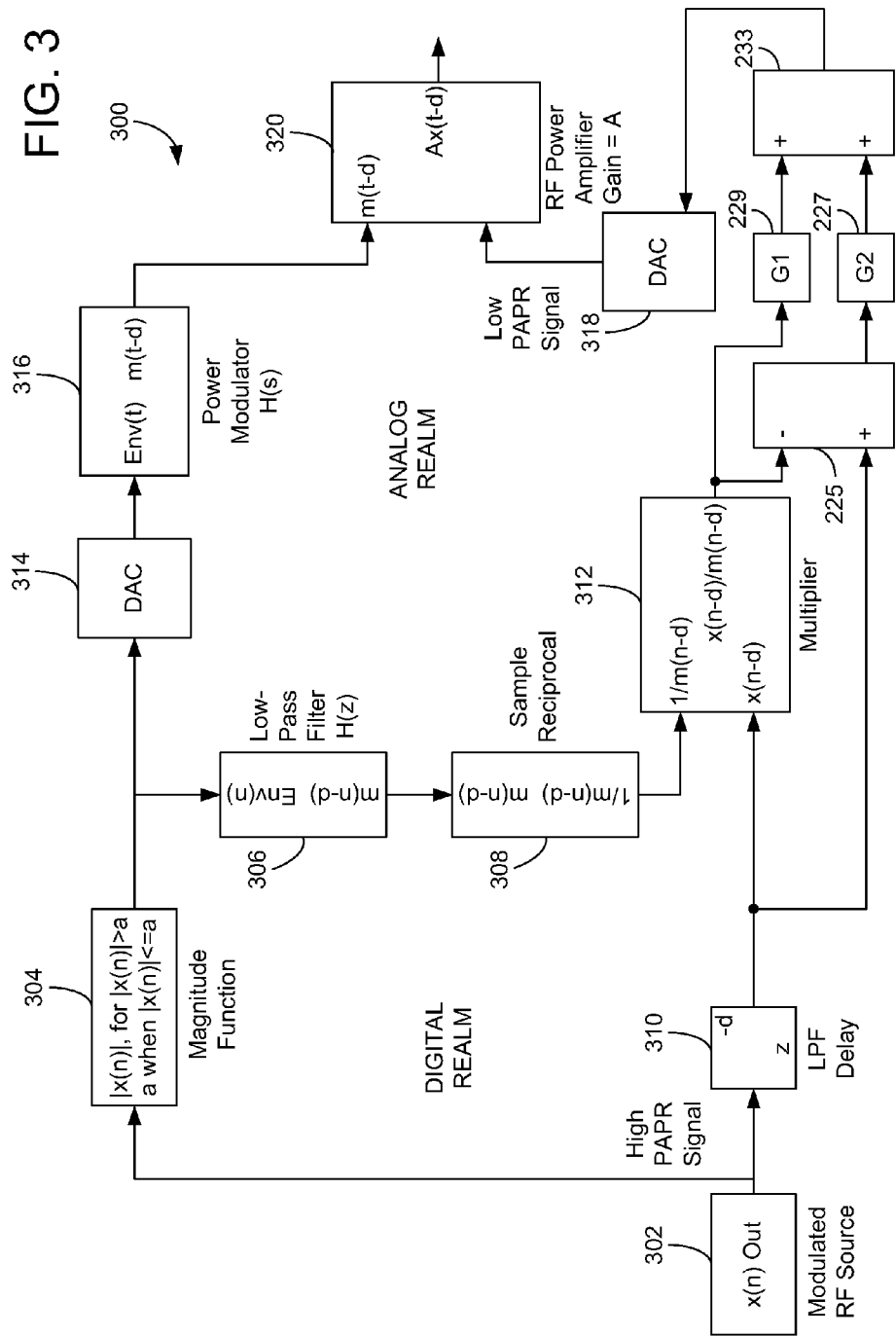

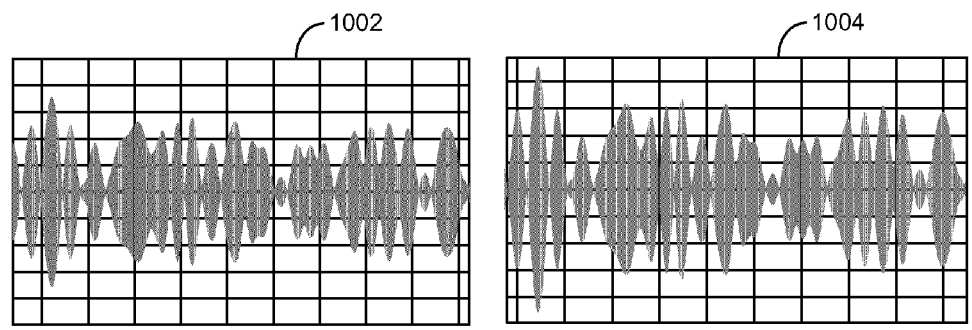
FIG. 10
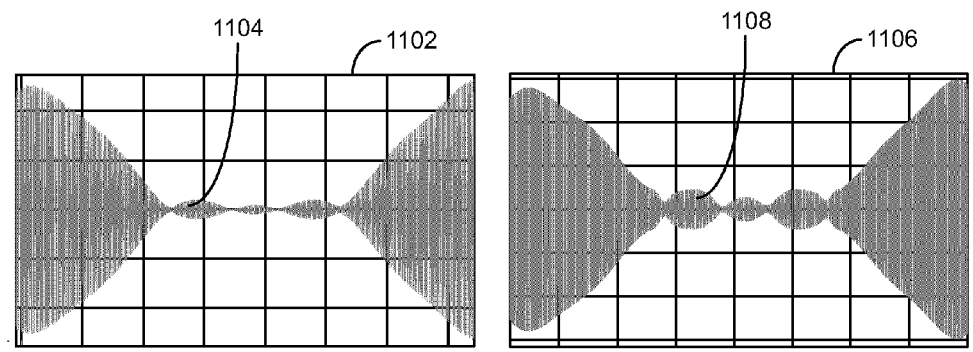
FIG. 11 (Prior Art)
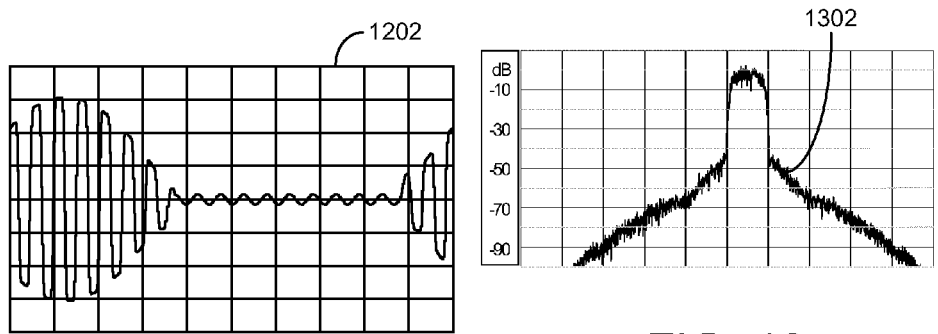
FIG. 12 (Prior Art)
FIG. 13

METHOD OF AND APPARATUS FOR SIGNAL AMPLIFICATION

CROSS REFERENCE TO RELATED APPLICATIONS

The present application is related to pending U.S. application Ser. No. 12/286,021 filed on Sep. 26, 2008 by Sorsby and assigned to the assignee of the present application and incorporated in its entirety herein by reference.

BACKGROUND

The present disclosure relates generally to the field of waveform generation. The present disclosure more particularly relates to power amplifiers (e.g., broadband power amplifiers).

Conventional broadband power amplifiers are used in a variety of waveform generation applications including electromagnetic communication systems (including radios, cellular phones, network devices, etc.), location devices, etc. According to one particular application, broadband power amplifiers are used in systems that can have high peak-to-average-power-ratio (PAPR) waveforms, such as orthogonal frequency division multiplexing (OFDM) and wideband code division multiple access (WCDMA) systems.

According to one example, conventional orthogonal frequency division multiplexing (OFDM) and wideband code division multiple access (WCDMA) systems often use radio frequency power amplifiers that exhibit power efficiencies under 20%. In addition, conventional power amplifiers can exhibit inefficiency and/or spectral non-compliance with wideband high peak-to-average-power-ratio (PAPR) waveform requirements, such as with Wideband Networking Waveform (WNW), FlexNet OFDM, Combat Data Link (CDL) and other waveform protocols. Low levels of power-efficiency can cause significant system limitations in size, weight, and operating time, or duty cycle, due to thermal constraints. In addition, low levels of power efficiency can limit the number of simultaneous signals which can be transmitted from a platform (e.g., airplane, mobile ground vehicle, helicopter, human-portable communication device, etc.) due to thermal constraints.

Various limited solutions exist for which operation can be restricted to a narrow range of frequencies (e.g., five percent bandwidth around operating frequency). Maintaining the necessary tolerances for successful operation of some of the solutions across an octave frequency range remains a challenge. Achieving high amplifier power-efficiency with high peak-to-average power ratio waveforms is difficult for a wide range of frequencies (e.g., 1 GHz to 2 GHz).

Progressive non-linearity of envelope tracking as radio frequency compression begins tends to limit the usefulness of envelope tracking techniques. The non-linearity requires complex distortion compensation schemes or limits improvements in power efficiency.

What is needed is a power amplification system and method that improves efficiency of the amplifier, covers wide frequency bands, and is suitable for handling multiple waveforms with low levels of distortion and noise output. Further still, there is a need for a power amplifier for use with wide band high peak-to-average-power-ratio (PAPR) waveforms. Yet further still, there is a need for a modulator that has higher efficiency and/or broad spectral performance. Yet further, there is a need for a linear high compression envelope tracking system and method. Still further, there is a need for a system for or a method of amplifying high PAPR waveforms with high efficiency. Other features and advantages will be made apparent from the present specification. The teachings disclosed extend to those embodiments which fall within the scope of the appended claims, regardless of whether they accomplish one or more of the aforementioned needs.

SUMMARY

An exemplary embodiment relates to a method of amplifying an input signal. A method includes separating the input signal into a first amplitude only component signal and a first composite radio frequency signal, and subtracting the first amplitude composite radio frequency signal from the input signal to provide an intermediate modulated radio frequency signal. The method also includes amplifying the intermediate amplitude modulated radio frequency signal with a higher gain factor with respect to the first amplitude composite radio frequency signal and adding the amplitude modulated radio frequency signal to the first amplitude composite radio frequency signal to create a second amplitude composite radio frequency signal exhibiting higher peak-to-average-power-ratio than the input signal.

An exemplary embodiment relates to a method of amplifying an input signal. The method includes separating the input signal into a first amplitude component signal and a first amplitude composite signal. The method also includes subtracting the first amplitude composite signal from the input signal to provide a difference signal, and amplifying the difference signal asymmetrically with respect to the first amplitude composite signal.

Another exemplary embodiment relates to a system. The system includes a first summer for subtracting a residual signal from an input signal. The system also includes a second summer for adding a first amplified signal from the first summer and a second amplified signal. The second amplified signal is related to the residual signal. The first amplified signal is amplified with the first gain and the second amplified signal is amplified with the second gain. The first gain is different from the second gain. The system also includes a power amplifier configured to receive a first sum signal from the second summer. In certain embodiments, the first gain or second gain can be a unitary gain.

Another exemplary embodiment relates to a transmitter configured to provide a modulated signal to an antenna based on input received from a data source. The transmitter includes an input interface for receiving the input from the data source. The transmitter also includes a modulator configured to modulate the input received at the input interface to generate a modulated signal. The system also includes an amplifier providing an amplified signal to the antenna interface. The system also includes a processing circuit configured to separate a dominant low-frequency amplifier from the modulated signal. The processing circuit also separates a residual signal from the modulated signal. The residual signal is a signal from which the dominant low-frequency amplified component has been removed. The processing circuit is further configured to subtract the residual signal from the input signal and provide a subtracted signal. The processor is further configured to sum a first signal related to the residual signal and a second signal related to the subtracted signal. The first signal and the second signal are asymmetrically amplified. The sum or a version thereof is provided to the amplifier.

Alternative exemplary embodiments relate to other features and combinations of features as may be generally recited in the claims.

BRIEF DESCRIPTION OF THE FIGURES

The exemplary embodiments will become more fully understood from the following detailed description, taken in conjunction with the accompanying drawings, wherein like reference numerals refer to like elements, in which:

FIG. 3 is a block diagram of a system for amplifying an input signal, according to an exemplary embodiment;

FIG. 10 is a waveform diagram of an input signal and an output signal for the system illustrated in FIG. 9 in accordance with an exemplary embodiment;

FIG. 11 is a waveform diagram of an input signal and an output signal for a conventional amplifier;

FIG. 12 is a waveform diagram of an output signal for a conventional amplifier;

FIG. 13 is a waveform diagram for the system illustrated in FIG. 9 in accordance with an exemplary embodiment;

DETAILED DESCRIPTION

Figures 1A, 1B:
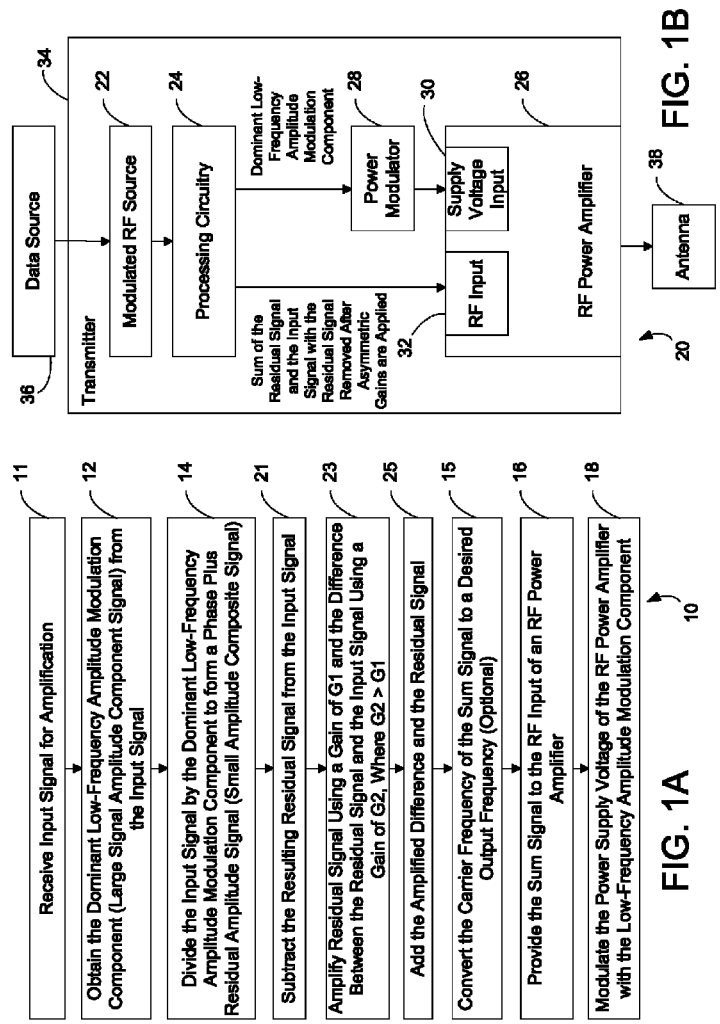
FIG. 1A is a top level flow chart of a process for amplifying an input signal, according to an exemplary embodiment.
FIG. 1B is a simplified block diagram of a system for amplifying an input signal, according to an exemplary embodiment.

Before turning to the figures, which illustrate the exemplary embodiments in detail, it should be understood that the application is not limited to the details or methodology set forth in the following description or illustrated in the figures. It should also be understood that the phraseology and terminology employed herein is for the purpose of description only and should not be regarded as limiting.

Referring generally to the Figures, an amplification technique regenerates a theoretically optimal signal in an embodiment. According to one embodiment, the amplification technique is a high efficiency technique using a power modulator bandwidth no greater than the signal information bandwidth. According to another embodiment, after separating a modulated radio frequency (RF) input signal into a low-frequency amplitude component and a complementary composite phase and amplitude component, the complementary composite phase and amplitude component is characterized by nearly constant peak amplitude. The nearly constant peak amplitude facilitates efficient amplification and simultaneously renders the system largely immune to minor distortions. The low-frequency amplitude component modulates the final amplifier supply voltage to achieve high power efficiency.

According to another embodiment, an amplitude modulated RF signal corresponding with the low-frequency amplitude component is formed by subtracting from the RF input signal the composite phase and amplitude component. The difference is asymmetrically amplified with respect to the low-frequency amplitude component. The amplitude modulated RF component signal and the composite phase and amplitude signal are summed after asymmetric amplification. The sum is provided to an amplifier limited by the low-frequency amplitude component. In one embodiment, a radio frequency (radio frequency) drive signal input for an envelope tracking power amplifier is separated into two distinct entities. Unique gains are applied to each and then the two components are recombined to form the radio frequency drive signal. The operation can be accomplished at baseband and or directly at radio frequency.

According to one embodiment, the summing, separating and difference steps are performed on digital signals. According to another embodiment, the sum is frequency converted before being received by the amplifier. The amplification technique can be used in a variety of waveform devices.

According to one embodiment, mathematical precision producing the complementary composite signal (without distortion correcting mechanisms such as pre-distortion) allows the technique to support theoretically optimum, or "lossless," signal reconstruction while using a power modulator bandwidth no greater than the information bandwidth, making the system unlike other high-level modulation techniques for complex signals. Unlike other high-efficiency modulating techniques, no significant distortion of the signal (signal loss) occurs with an embodiment of the technique. Separating out the low-frequency amplitude component from the complex modulated input signal advantageously allows an embodiment of the technique to support theoretically optimum signal reconstruction.

Certain embodiments provide a high-level amplification technique for complex signals which combines practical implementation, high power-efficiency, and theoretically optimal signal reconstruction. Traditional approaches toward high-level modulation have all required power modulators to have bandwidths considerably greater than the information bandwidth. According to one embodiment, however, power modulator bandwidth need not be greater than the information bandwidth.

According to one embodiment, the technique splits apart a complex input signal, extracting the bulk (or a dominant portion) of the low-frequency amplitude modulation and subsequently applying the separated low-frequency amplitude modulation to the amplifier supply voltage. According to one embodiment, an amplitude-only modulated RF signal is created by subtracting the complementary composite phase and amplitude component RF signal from the RF input signal. The amplitude-only modulated RF signal corresponds with the low-frequency amplitude component signal. In one embodiment, mathematical precision inherent in the process advantageously ensures that minimal distortion is generated.

According to one embodiment, a dual gain approach to the large signal amplitude modulation components is added envelope tracking techniques. Combining the partial envelope technique with envelope tracking offers a solution to inherent gain inequity in one embodiment. Advantageously, substantial removal of the baseband modulating envelope in the technique allows application of asymmetrical gain in the drive channel in one embodiment. In one embodiment, a higher gain is applied to the large signal component within the radio frequency drive signal.

In one embodiment, an amplitude modulated radio frequency signal component is developed to correspond with the dominant low-frequency amplitude-only component removed from the input signal. The amplitude modulated radio frequency signal component is then amplified using higher gain than applied to the residual signal before being recombined with the amplified residual signal. This recombined signal provides a higher peak-to-average-power-ratio (PAPR) input signal to the power amplifier, even though non-linear processes were not used to generate the signal.

In another embodiment, the method yet further includes providing an amplifier supply voltage as a function of the dominant low-frequency amplitude component. Because only linear processes are used to form the constituent signals in one embodiment, extremely high linearity is maintained at the final amplifier output, even when the amplifier is driven well into compression.

Referring now to FIG. 1A, a top level flow chart of a process 10 for amplifying an input signal is shown, according to an exemplary embodiment. The input signal can be a modulated signal, such as a quadrature amplitude modulated signal, a frequency modulated signal, a phase modulated signal, an orthogonal frequency division multiplexing (OFDM) signal, a wideband code division multiple access (WCDMA) signal, etc. Process 10 is shown to include the step of receiving an input signal for amplification (step 11). Process 10 is further shown to include the step of obtaining the low-frequency amplitude modulation component from the input signal (e.g., a large signal amplitude component from the input signal) (step 12). Process 10 is yet further shown to include the step of dividing the input signal by the low-frequency amplitude modulation component (e.g., the dominant low-frequency amplitude modulation component) to obtain a residual signal (e.g., a phase plus residual amplitude signal, the high-frequency amplitude modulation component of the input signal, the small amplitude component signal, etc.) (step 14). The residual signal can contain a small amplitude modulation component signal.

According to one embodiment, the residual signal is subtracted from the input signal (step 21) to provide a large amplitude composite RF signal. The residual signal is amplified using a gain of G1 and the difference between the input signal and the residual signal (e.g., the large amplitude composite RF signal) is amplified using a gain of G2 (step 23). G2 more than G1 in one embodiment. G1 or G2 can be equal to 1 in certain embodiments. The amplified residual signal and the amplified difference are combined (e.g., added) (step 25).

According to various alternative exemplary embodiments, the carrier frequency of the added signal from step 25 is converted to a desired output frequency (step 15). Step 15 is optional. The added signal (frequency converted or non-converted) is provided to the radio frequency input of an radio frequency power amplifier (step 16). The peak radio frequency power amplifier output level is limited by the low-frequency amplitude modulation component. In one embodiment, the radio frequency power amplifier can be limited by providing the low-frequency amplitude modulation component to the power supply input of the radio frequency power amplifier, thereby modulating the radio frequency power amplifier with the low-frequency amplitude modulation component (step 18).

Referring now to FIG. 1B, a simplified block diagram of a system 20 for amplifying an input signal (e.g., using process 10) is shown, according to an exemplary embodiment. System 20 is shown to include a modulated radio frequency source 22 configured to provide an output that serves as the input signal (e.g., a complex input signal, a complex modulated input signal, a complex wideband input signal, a signal with a high peak-to-average power ratio, a composite signal, etc.) for system 20 and is intended to be amplified with minimum distortion by radio frequency power amplifier 26. The input signal is provided from the modulated radio frequency source 22 via cabling, PCB traces, a digital medium, an analog medium, or via any other medium. According to an exemplary embodiment, modulated radio frequency source 22 and processing circuitry 24 are a part of the same circuitry or circuit board. In one embodiment, processing circuitry 24 is configured to conduct one or more of the activities described herein for providing a low-frequency amplitude modulation component and a residual signal having the high-frequency amplitude modulation component.

In one embodiment, processing circuitry 24 is configured to: 1. separate a large amplitude component signal and a small amplitude composite signal; 2. subtract the small amplitude-only RF signal from the input signal to form a large amplitude-only RF signal; and 3. add the difference signal and the small amplitude composite signal after asymmetric gains are applied. In one embodiment, the processing circuitry 24 operates in the digital domain. Various circuit components/mathematical operations can be utilized to accomplish the above-described operations without departing from the scope of the invention. For example, any number of digital processing subroutines or FPGA configurations can be employed to perform the operations described above.

According to another embodiment, processing circuitry 24 conducts the steps of obtaining the low-frequency amplitude modulation component from the input signal and of dividing the input signal by the low-frequency amplitude modulation component to obtain the residual signal. The residual signal (e.g. small amplitude composite signal) is subtracted from the input signal to obtain a difference signal (e.g., large amplitude-only RF signal). The processing circuitry applies different gains to the residual signal and the difference signal and sums the amplified difference signal and residual signal. Processing circuitry 24 is shown in FIG. 1B to provide the sum signal (having an amplitude modulation component counterpart to the low-frequency amplitude modulation component) to radio frequency input 32 of radio frequency power amplifier 26. Processing circuitry 24 provides the low-frequency amplitude modulation component or the large amplitude component signal to power modulator 28 which modulates power supply input 30 of power amplifier 26. In one embodiment, radio frequency power amplifier 26 amplifies the signal at the radio frequency input while power modulator 28 is modulating power input supply 30, resulting in an amplified signal that is distortionless (or near distortionless).

Referring further to FIG. 1B, elements 22-32 in FIG. 1B are shown as part of a transmitter 34, according to an exemplary embodiment. Transmitter 34 receives data for modulation, amplification, and transmission from data source 36 and provides modulated and amplified signals to antenna 38 for radio frequency transmission. It should be noted transmitter 34 could be implemented as a part of a transceiver. Alternatively, transmitter 34 can be a sensor or any other device requiring an amplified waveform.

An alternative embodiment relates to a modulator configured to produce a desired complex modulated signal from a radio frequency transmitter based on input from a data source. In this alternative embodiment, the dominant low-frequency amplitude modulation component and the residual signal do not originate from a single modulated data stream. The modulator includes an input interface receiving the input from the data source. The modulator further includes an amplitude modulation element generating a dominant low-frequency amplitude signal. The modulator yet further includes a modulation circuitry configured to generate a sum signal related to a residual signal having phase information and having amplitude information complementary to the dominant low-frequency amplitude signal and a difference between the residual signal and the input signal. The modulation circuitry may also be configured to modulate a carrier frequency with the sum signal prior to subsequent amplitude modulation by the dominant low-frequency amplitude signal.

Figure 1C:
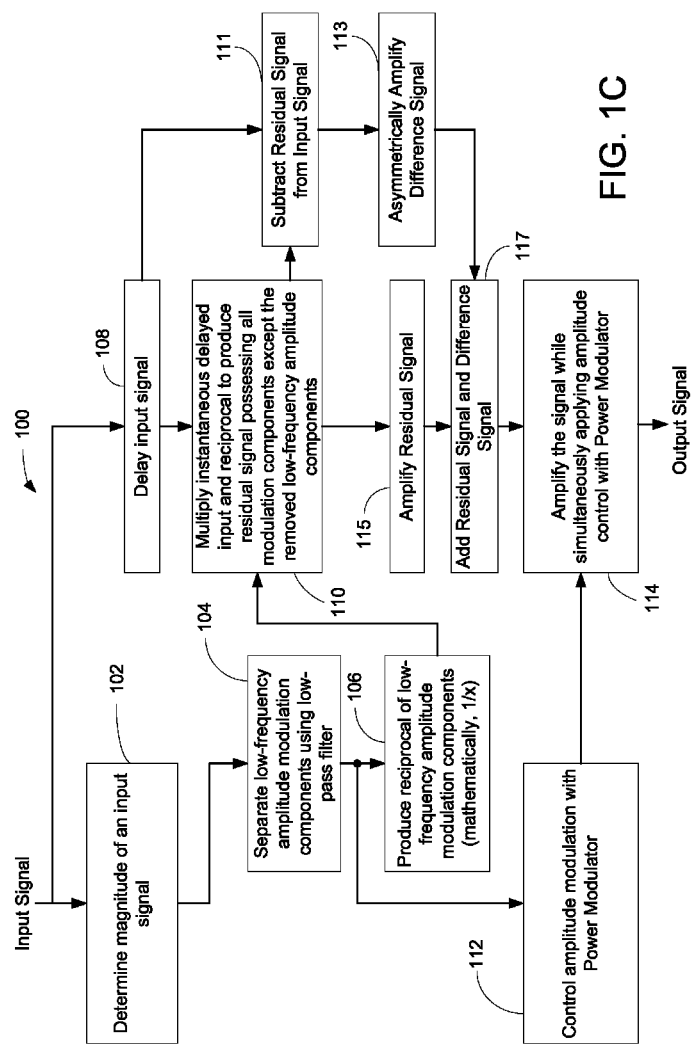
FIG. 1C is a more detailed flow chart of a process for amplifying an input signal, according to an exemplary embodiment.
Figure 2:
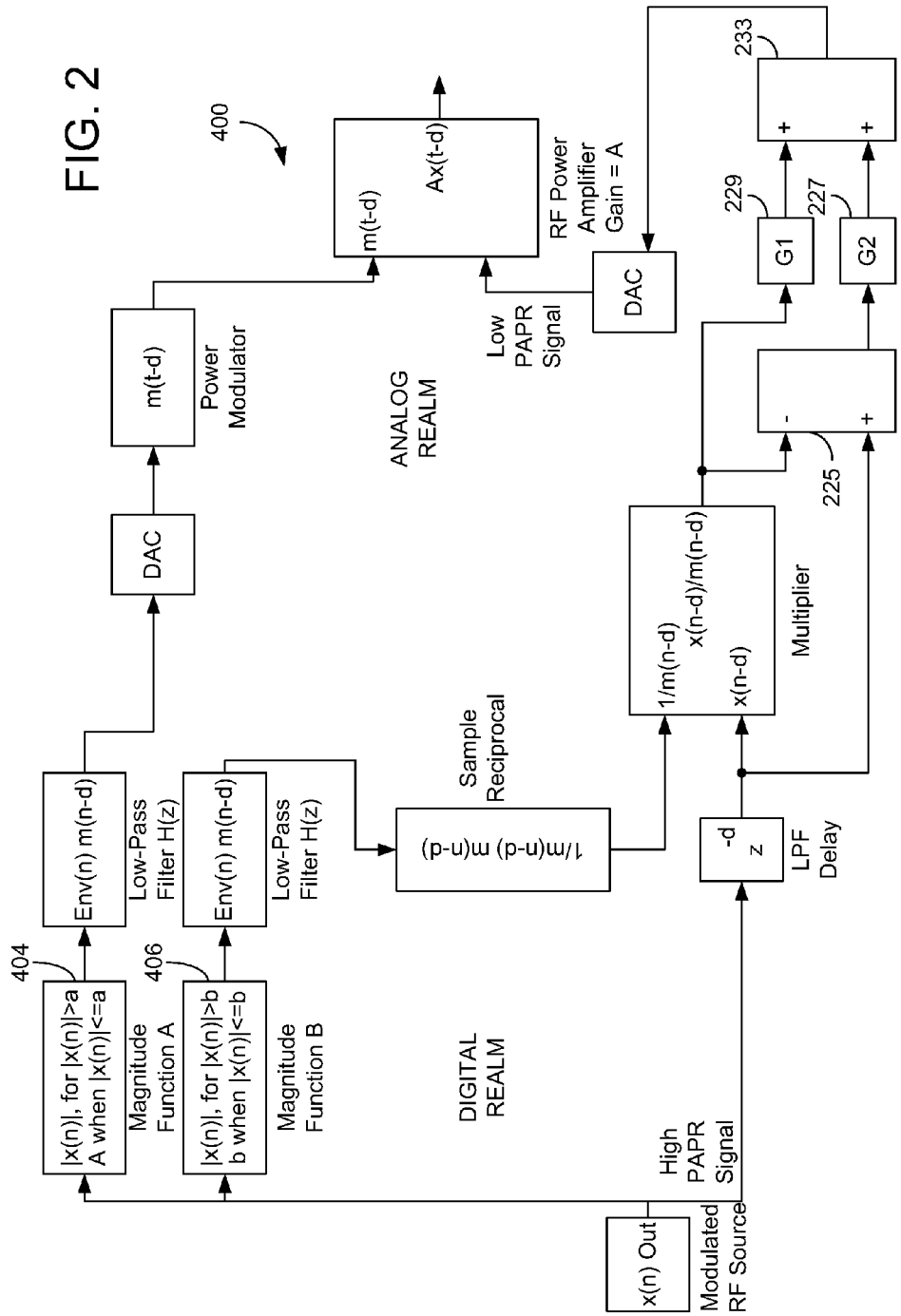
FIG. 2 is a block diagram of a system for amplifying an input signal, according to an exemplary embodiment.

Referring now to FIG. 1C, a more detailed flow chart of a process 100 for amplifying a modulated input signal is shown, according to an exemplary embodiment. Process 100 is shown to include the step of determining the magnitude of the input signal (step 102). According to an exemplary embodiment, the entirety of the output signal from step 102, including the trough, varies from zero to some positive number. A low-pass filter is then used to separate (step 104) the dominant low-frequency amplitude modulation component from the output of step 102. Processing then provides the reciprocal of the dominant low-frequency amplitude modulation component (step 106)(e.g., 1/x, mathematically). The original input signal is delayed in step 108 to account for any delay associated with steps 102-106. The original input signal is then multiplied by the reciprocal provided in step 106 to produce a residual signal that possesses all modulation components except the dominant low-frequency amplitude modulation components. In one embodiment, the output of process step 110 is a phase plus residual amplitude signal from which the dominant low-frequency component has been removed (e.g., the residual signal). Alternatively, other techniques can be utilized to separate or otherwise provide large signal amplitude component signal and a small amplitude composite signal.

In step 111, the residual signal is subtracted from the delayed input signal. In a step 115, the residual signal is amplified using a first gain. In a step 113, the difference from step 111 is amplified using a second gain. The second gain is different than the first gain. In a step 117, the amplified difference signal is combined (e.g., added) to the amplified residual signal.

In step 112, the dominant low-frequency amplitude modulation component is provided to a power modulator (which may have intrinsic low-pass filter response—in which case, a signal that has not been filtered may be provided to power modulator). The dominant low-frequency amplitude modulation component is then provided to the power supply input via the power modulator while simultaneously applying the sum signal from step 117 (e.g., having primarily high-frequency amplitude modulation components). The sum signal from step 117 is provided to the power modulator signal input (step 114).

Figure 4A:
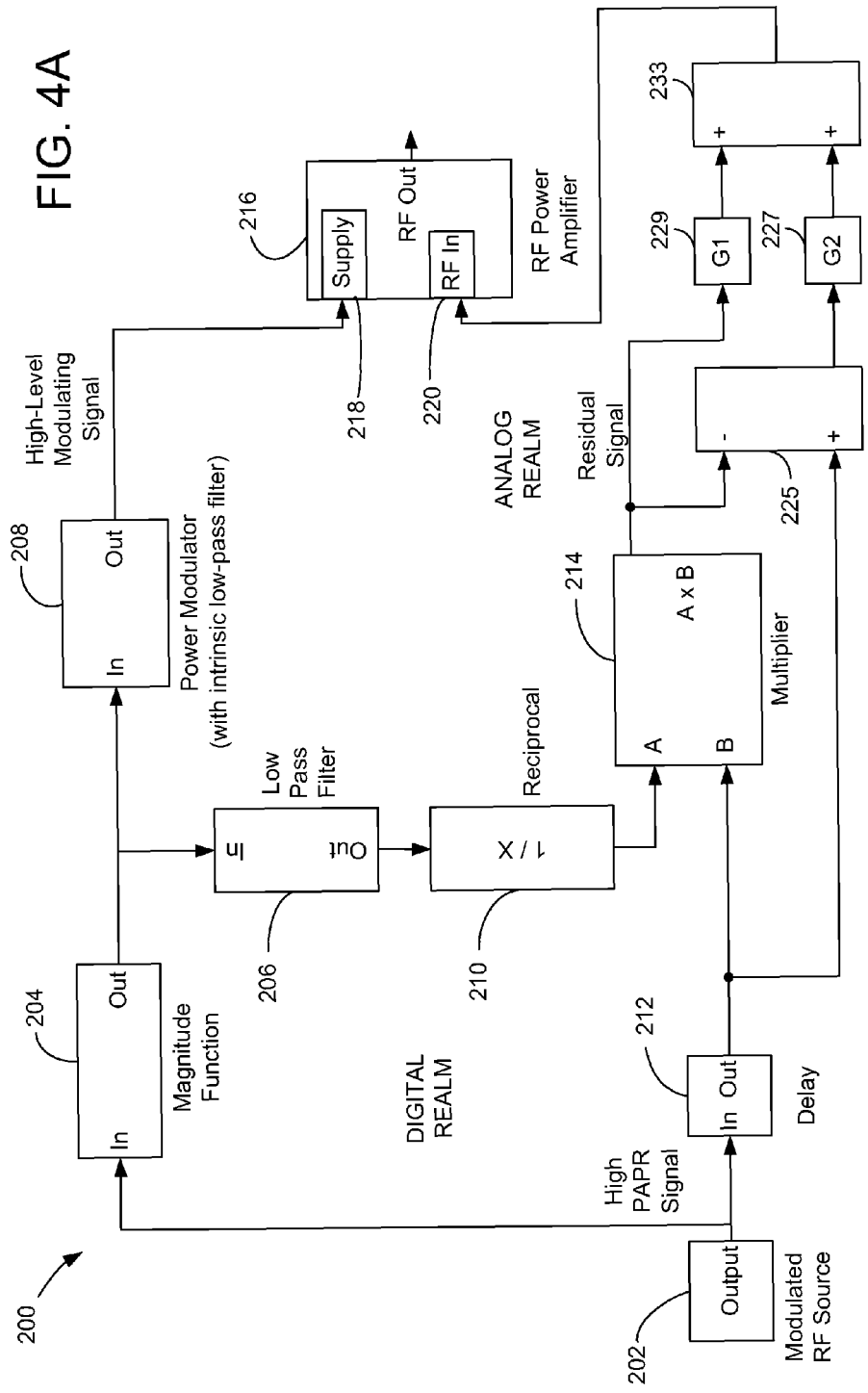
FIG. 4A is a block diagram of a system for amplifying an input signal, according to an exemplary embodiment.

Referring now to FIG. 4A, a block diagram of a system 200 for amplifying a modulated input signal is shown, according to an exemplary embodiment. System 200 is shown to include a modulated radio frequency source 202. According to an exemplary embodiment, the input signal is a composite signal, such as, a high peak-to-average-power-ratio (PAPR) signal. The input signal is provided to a magnitude function 204. The magnitude function 204 provides the result of its activity to low-pass filter 206 and power modulator 208. Reciprocal element 210 produces the reciprocal (mathematically, 1/x) of the dominant low-frequency amplitude modulation component separated by low pass filter 206. The reciprocal is provided to multiplier 214 which multiplies the output from delay element 212 to produce a residual signal having all modulation components (e.g., phase, high-frequency amplitude components, etc.) of the input signal except the dominant low-frequency amplitude components. Output from magnitude function 204, as previously mentioned, is also provided to power modulator 208 having an intrinsic low-pass filter. Power modulator 208 outputs a high-level modulating signal which is provided to supply voltage input 218 of radio frequency power amplifier 216. radio frequency power amplifier 216 receives a sum signal from an adder 233. The sum signal is related to the residual signal amplified at a gain of G1 by an amplifier 229 and a difference signal amplified at gain of G2 by an amplifier 227. The difference signal is provided by a subtractor 225. Subtractor 225 receives the residual signal from multiplier 214 and the input signal multiplier 214 from output 202. In one embodiment, Gain G1 is less than G2.

Radio frequency input 220 input receives the sum signal from adder 233. radio frequency power amplifier 216 amplifies the sum signal provided to radio frequency input 220 while power modulator 208 is providing the low-frequency amplitude modulation component to supply 218, modulating the amplifier's supply voltage as a function of the low-frequency amplitude modulation component. In one embodiment, the low-frequency amplitude component can be amplified to give the envelope tracking signal a gain (e.g., GA). The gain of the large signal amplitude composite signal can be GB. In one embodiment, GB is greater than GA and the gain for the small amplitude composite signal is equal to GA.

Delay circuitry can be provided in amplifiers 227 and 229, subtractor 225, and/or adder 233 in one embodiment. Operations by amplifiers 227 and 229, subtractor 225, and/or adder 233 can be performed in the digital domain in one embodiment. Various modifications can be made to circuitry of FIG. 4A-9 without departing from the scope of the invention. For example, a single amplifier can be utilized in one of the paths associated with amplifiers 227 and 229. Subtractors and adders can be interchanged by appropriately inverting signals at inputs. The large signal amplitude component signal and the small amplitude composite component signal can achieve linearity if the gain of the large envelope signal is equal to the gain in the small signal which is equal to GA. In one embodiment, the gain of the lower large signal is equal to GB which is greater than GA and the gain of amplifier 229 is less than the gain of amplifier 227 (G2 is greater than G1). In one embodiment, lower small-amplitude composite signal gain and upper large signal gain must be equal if re-composed operatives are to faithfully replicate the input.

Figure 4B:
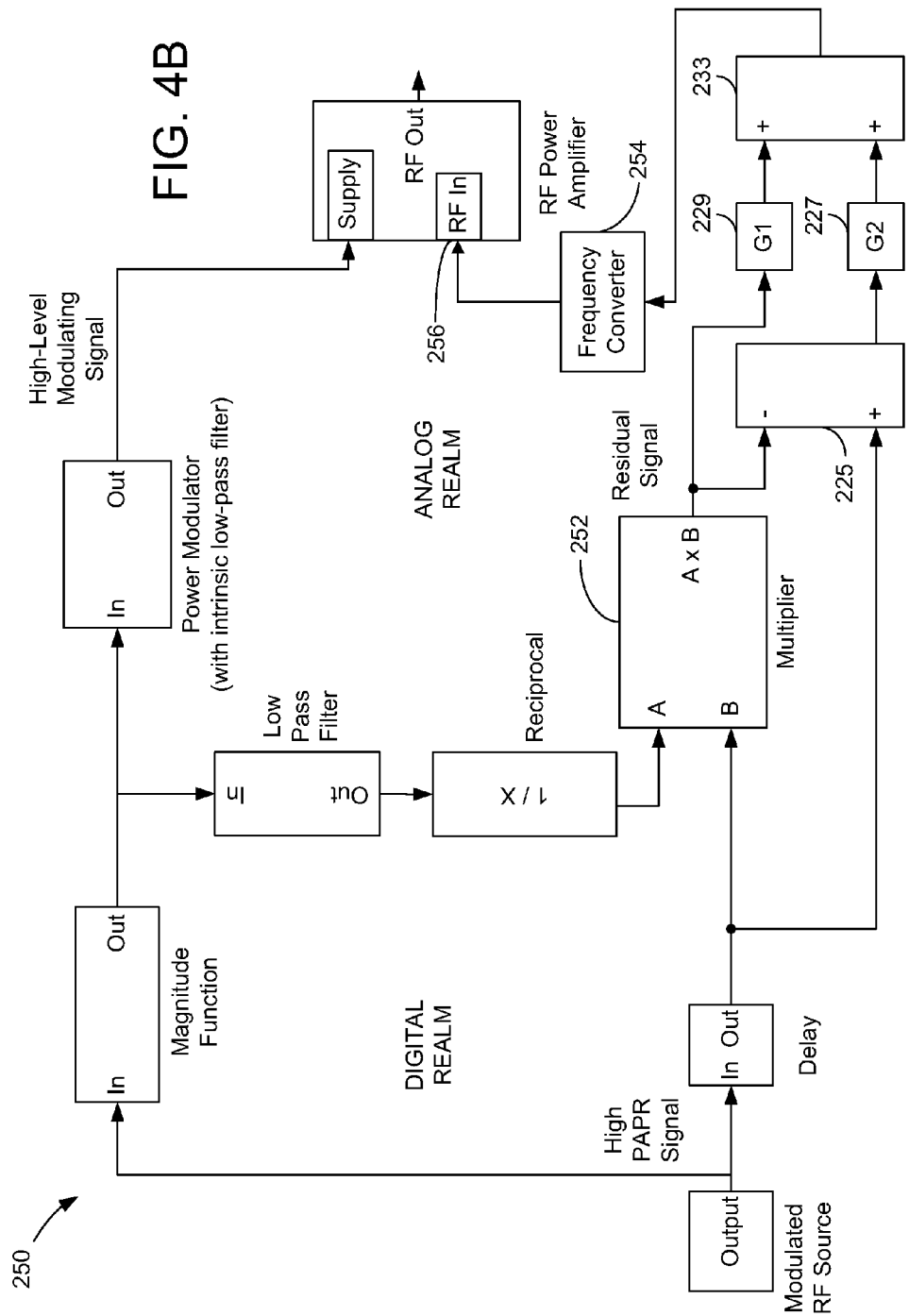
FIG. 4B is a block diagram of a system for amplifying an input signal, according to an alternative exemplary embodiment.

Referring now to FIG. 4B, a block diagram of a system 250 for amplifying a modulated input signal is shown, according to an alternative exemplary embodiment. In the embodiment shown in FIG. 4B, frequency converter 254 is shown to receive the sum signal from adder 233. Frequency converter 254 can upconvert the carrier frequency of the sum signal to a new carrier frequency (e.g., a desired carrier frequency) and provide the upconverted sum signal to radio frequency input 256. It should be noted that throughout this specification and the claims various aspects of the signal could be adjusted (filtered, upconverted, downconverted, upsampled, shifted, etc.) without departing from the scope of the appended claims.

Referring now to FIG. 3, a more detailed block diagram of a system 300 for amplifying a modulated input signal is shown, according to an exemplary embodiment. Modulated radio frequency source 302 is shown as outputting a modulated high-PAPR input signal x(n). Magnitude function 304 is shown to output the magnitude of the signal when the magnitude is greater than a threshold "a" and to output the threshold a when the magnitude is less than or equal to "a". Magnitude function 304 effectively shifts samples provided to it so that even the troughs of the signals are above some threshold (e.g., above threshold "a", above zero, etc.). Output from the magnitude function, envelope signal Env(n), is provided to DAC 314 and low-pass filter 306. DAC 314 converts Env (n) into its continuous time counterpart Env(t), which is subsequently low-pass filtered in accordance with the transfer function characteristics of power modulator 316 having transfer function H(s) to obtain the final modulating signal m(t−d), where d represents the delay introduced by H(s).

The signal Env(n) travels an alternate path in the discrete-time domain (i.e., digital domain) to undergo filtering through low-pass filter 306 (e.g., a discrete-time low-pass filter) having transfer function H(z), which is the discrete-time counterpart to the continuous-time transfer function H(s). The output from low-pass filter 306 can be represented by m(n−d) and is the discrete-time counterpart (or as close as possible, given normal hardware inaccuracies) to the continuous time modulating signal m(t−d). Sample reciprocal element 308 provides the reciprocal of the output from low-pass filter 306 (i.e., m(n−d)) to multiplier 312. Multiplier 312 is also provided delayed samples of x(n), the delay provided by delay element 310, the magnitude of the delay corresponding to the delay of low-pass filter 306. The signal provided at the output of multiplier 312 is: (x(n−d)/(m(n−d)). In generalized terms, the sum signal provided from adder 233 as an intermediate signal is: G1 x(n−d) for levels below unity, 1+G2*[x(n−d)−1] for levels above unity. Here, unity corresponds with the P1 dB input compression point of the RF power amplifier 320. DAC 318 receives the intermediate signal and outputs a continuous time signal. Accordingly, the low-frequency amplitude modulation component is provided to the power supply input of radio frequency power amplifier 320 via power modulator 316. When amplified and modulated at radio frequency power amplifier 320, the output becomes: x(t−d), which is the desired result—amplification of the input signal x(n).

Referring still to FIG. 3, when power modulator 316 (and/or its transfer function H(s)) is restricted so that its bandwidth approximates the information bandwidth, then the low-frequency amplitude modulation component m(n−d) provided to power modulator 320 approximates the envelope of x(n−d) except during amplitude troughs. Therefore, radio frequency power amplifier 320 can be designed to operate very efficiently when amplifying a high-PAPR signal. Simulations for the technique indicate that strict linearity in the power amplifier stage, using this method/design is not necessary. Simulation data shows that good results can be obtained with power amplifier 320 operated well into saturation without adversely affecting output signal fidelity. For example, operation with between 2 dB and 6 dB of compression have yielded good experimental results.

Referring now to FIG. 4, a block diagram of a system 400 for amplifying a modulated input signal is shown, according to an alternative exemplary embodiment. It has been observed that dual thresholds can be used to efficiently offset a level shift resulting from compression within the power amplifier. When the system is operated with dual thresholds (as is shown in system 400, illustrated by different magnitude functions A and B), distortion to the envelope can be minimized, resulting in negligible channel interference. Overall transmitter power-efficiency (including power modulator efficiency and power amplifier efficiency) is expected to be in the fifty to seventy five percent range. According to the exemplary embodiment shown in FIG. 4, magnitude function 404 is configured to ensure a minimum signal threshold "a" while magnitude function 406 is configured to ensure a minimum signal threshold "b."

Figure 5:
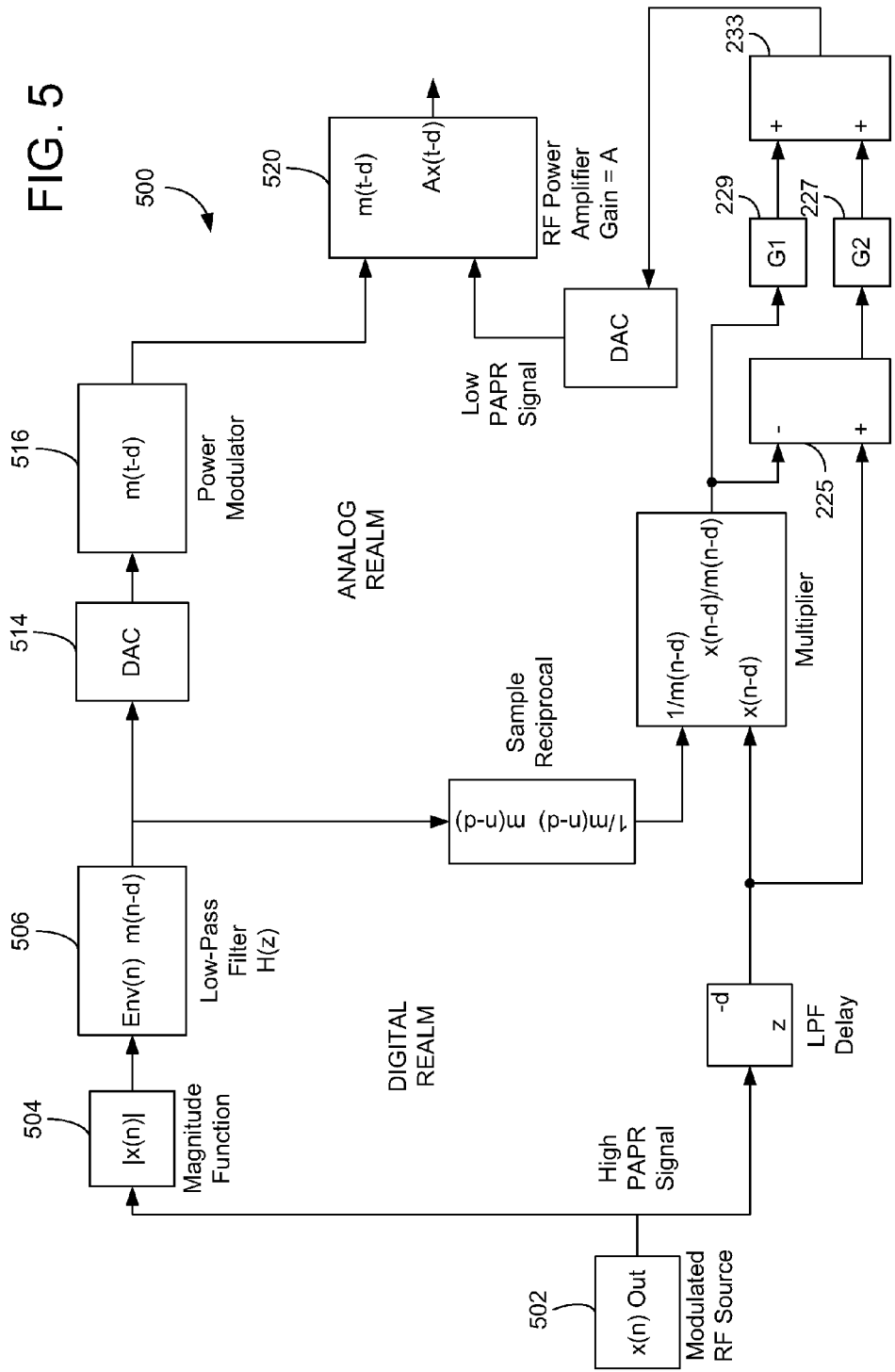
FIG. 5 is a block diagram of a system for amplifying an input signal, according to an exemplary embodiment.

Referring now to FIG. 5, a block diagram of a system 500 for amplifying a modulated input signal is shown, according to an alternative exemplary embodiment. System 500 and FIG. 5 illustrate an implementation where the signal envelope is determined directly from a digitally modulated input stream. This system could be implemented when the exciter (i.e., modulated radio frequency source 502) and the power amplifier are physically separated but the exciter can easily provide the fully modulated signal in digital form. According to the exemplary embodiment shown, the output of the low-pass filter is provided to DAC 514 (and thereby power modulator 516). This configuration assumes that the frequency response of power modulator 516 is sufficiently larger than the low-pass filter response H(z) and that power modulator 516 response has negligible effect on the final waveform and can be ignored.

Figure 6:
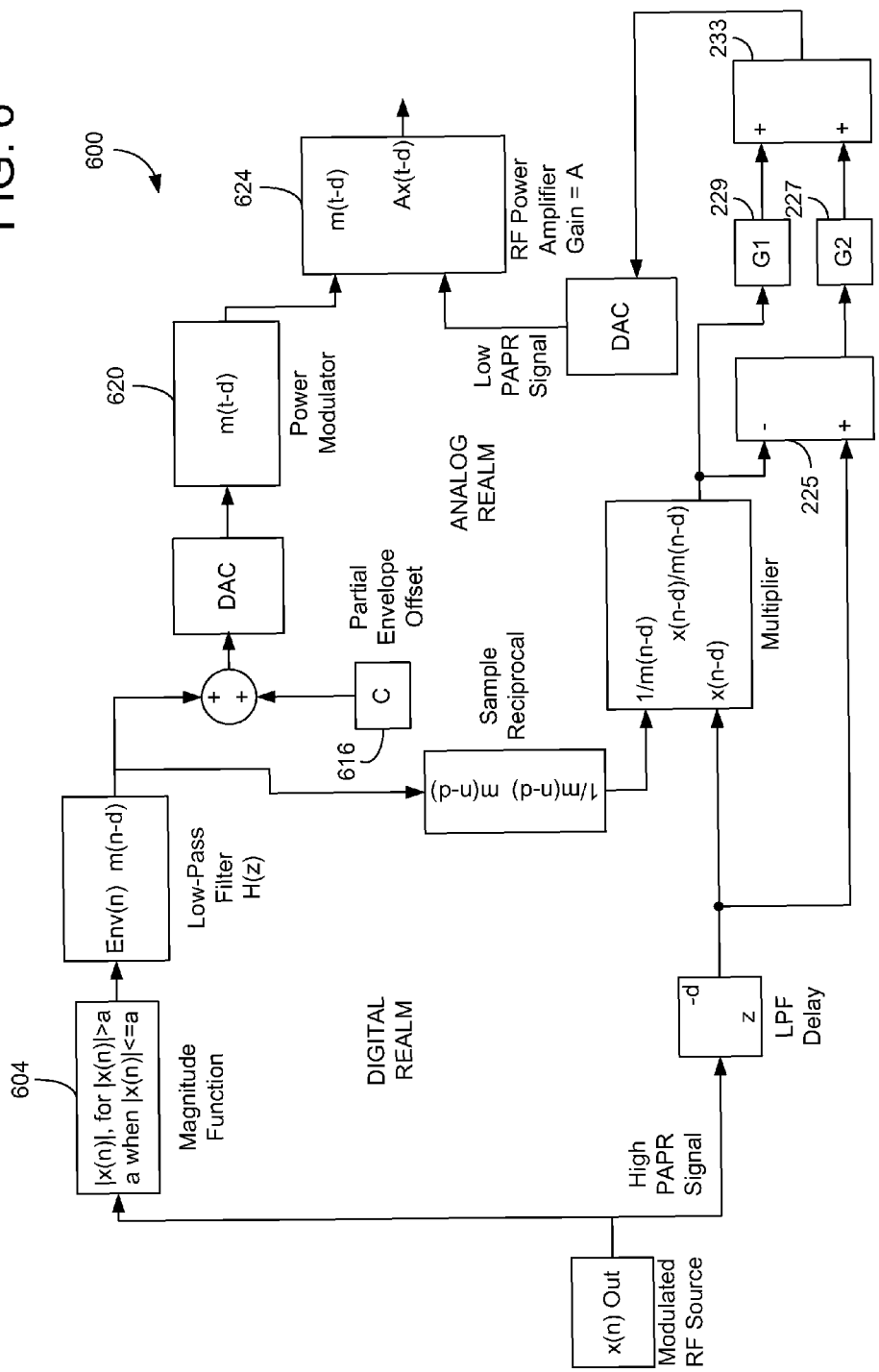
FIG. 6 is a block diagram of a system for amplifying an input signal, according to an exemplary embodiment.

Referring now to FIG. 6, a block diagram of a system 600 for amplifying a modulated input signal is shown, according to an alternative exemplary embodiment. System 600 advantageously includes enhancements which control negative amplitude modulation excursions. The distortion-generating high-frequency components of many high-PAPR waveforms reside predominantly within the troughs, or negative peak excursions, of the modulation. Controlling some aspects of these negative modulation excursions allows considerable spectral containment to be accomplished without resorting to elaborate measures. Magnitude function 604 (i.e., magnitude detector) includes a threshold adjustment which shifts the percentage of negative modulation which is being transferred to the high-level modulator and a negative peak offset control 616 adjusts for expansion that compression imparts to the trough. The introduction of an offset on the re-modulated negative peak amplitude moves the waveform low-frequency amplitude valleys closer to zero, thereby diminishing the wideband spectrum components which would otherwise appear at the output of power amplifier 624. The threshold control activity at the magnitude function (i.e., envelope detector) varies the amplitude of the negative excursions re-modulated via the power-modulator 620. For example, if the threshold were to be set too high, then no modulation would be transferred to power modulator 620. A more optimum threshold value for minimizing broadband spectral components occurs when the threshold is set near the inflection points of the waveform amplitude modulation.

Figure 7:
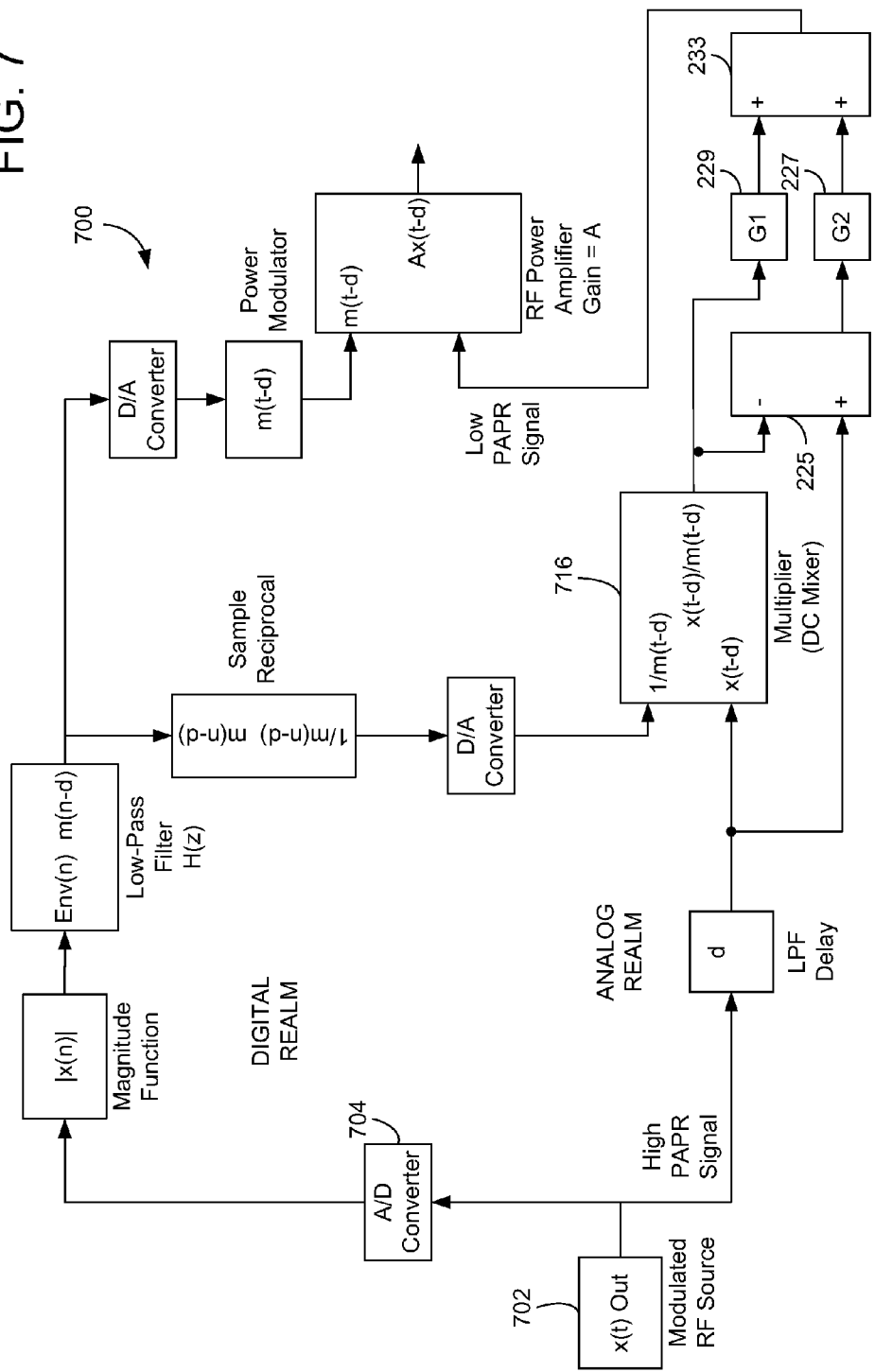
FIG. 7 is a block diagram of a system for amplifying an input signal, according to an exemplary embodiment.

Referring now to FIG. 7, a block diagram of a system 700 for amplifying a modulated input signal is shown, according to an alternative exemplary embodiment. In system 700, modulated radio frequency source 702 is an analog source that provides a modulated analog signal (i.e., the radio frequency signal is provided from modulated radio frequency source 702 in traditional analog fashion). Relative to the previously described embodiments, A/D converter 704 is provided between modulated radio frequency source 702 and magnitude function 706, and multiplier 716 is a DC mixer.

Figure 8:
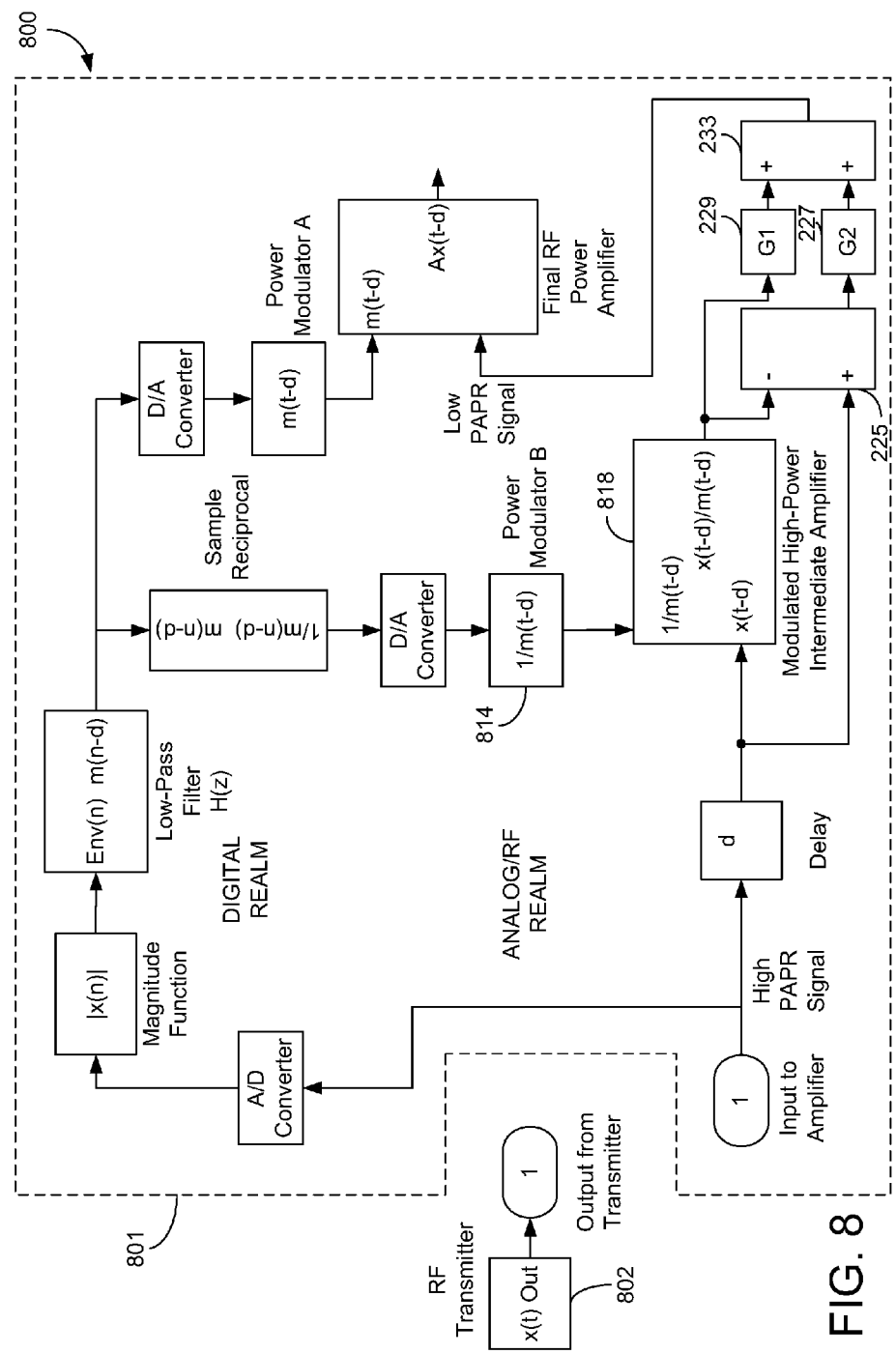
FIG. 8 is a block diagram of a system for amplifying an input signal, according to an exemplary embodiment.

Referring now to FIG. 8, a block diagram of a system 800 for amplifying a modulated input signal is shown, according to an alternative exemplary embodiment. In system 800, the amplifier 801 is shown physically separated from the exciter (i.e., radio frequency transmitter 802). The radio frequency signal is provided in traditional analog fashion. The technique of partial envelope transference supports such usage while still maintaining inherent power efficiency advantages. As shown, the component providing the reciprocal is power modulator 814 (the power modulator has a transfer function of 1/m(t−d)), which provides the reciprocal to modulated high-power intermediate amplifier 818. A minimum amount of signal processing is required to provide the partial envelope transference activity. Further, all staged in such a high-power amplifier module could be operated in a power efficient manner, including efficient use of input signal power. For example, an input signal provided at an intermediate power level could be efficiently amplified by the high-power intermediate amplifier, which itself can be high-level modulated to achieve high power efficiency. With the technique of partial envelope transference, no need for frequency conversion does not exist, high-stability oscillators are not required, reversion to baseband for signal regeneration is not required, and a need to reduce input signal power to accomplish small-signal operations on the input signal does not exist. Further, amplification can be achieved on-frequency, as with conventional power amplifiers.

Figure 9:
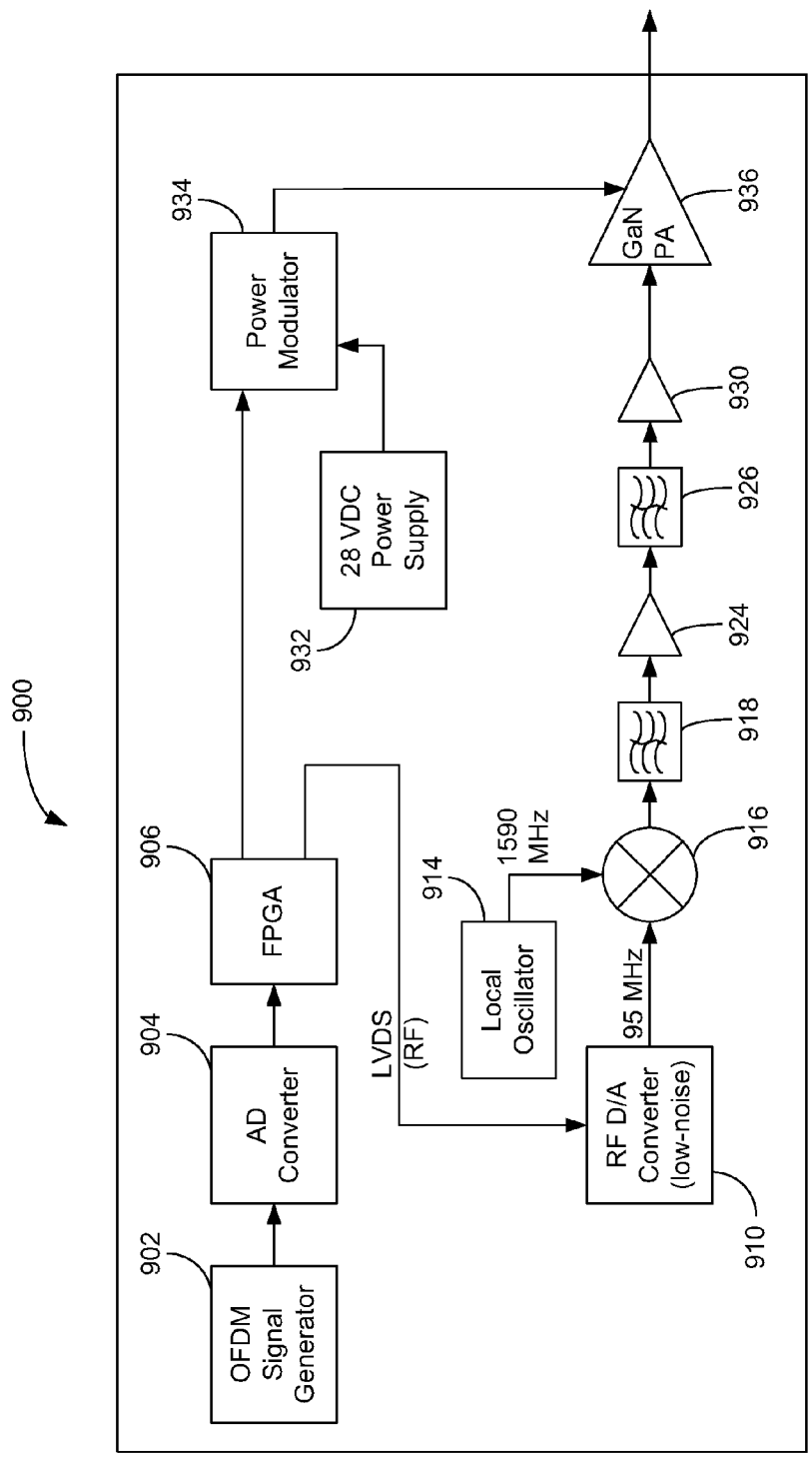
FIG. 9 is a general block diagram of a system for amplifying an input signal, according to an exemplary embodiment.

With reference to FIG. 9, circuit 900 includes an OFDM signal generator 902, an ND converter 904, an FPGA 906, a power modulator 934, a power supply 932, a power amplifier 936, a radio frequency DA converter 910, a mixer 916, an oscillator 914, a band pass filter 918, a buffer 924, a band pass filter 926, and a buffer 930. The OFDM signal generator provided signal is digitized by converter 904.

FPGA 906 preferably performs the digital operations associated with FIGS. 1A-8 and the generation of the sum signal in the digital domain. FPGA 906 can provide the low voltage differential signaling (LVDS) envelope drive signal (e.g., large amplitude component signal in one embodiment) for modulator 934 and the LVDS radio frequency drive signal (e.g., a sum signal in one embodiment) for converter 910. Oscillator 914 can provide a 159 MHz signal.

Circuit 900 operates to amplify high peak-to-average power ratio (PAPR) waveforms. FPGA 906 implements a dual gain approach to large signal amplitude modulation components, thereby offering a solution to gain inequities inherent in envelope tracking schemes. Substantial removal of base band modulating envelopes in the partial envelope technique allow application of asymmetrical gain within the radio frequency drive channel to amplifier 936 which can be a GaN power amplifier. To provide higher relative levels needed during signal compression, a higher gain is applied to the large signal component within the radio frequency drive signal. Simulation testing of circuit 900 was conducted using a 9+PAPR OFDM input signal. Results are provided in Table 1 below:

The results of Table 1 can be compared against results for an L-Band PA using GaN devices. Table 1 shows measured results for radio frequency power out, noise power-ratio (NPR) and efficiency operating from 22-30 VDC which can be compared to results for class AB architectures for GaN amplifier. Circuit differences, such as lack of pre-regulating power supply and its inefficiency if used class AB GaN amplifier can make comparisons subjective. With a boundary condition of 22-30 VDC supply, data indicates 5 dB greater power output at 30 dB NPR available using partial envelope tracking. Though not directly measured, the data in Table 1 supports a compression estimate of 4.5 dB.

As shown in Table 2 below, the average power output from a conventional L-Band power amplifier (PA) operating from 50 volt supply is slightly over 44 dBm from 4 devices which equates to a little over 38 dBm from a single device. This performance failed to achieve the performance level demonstrated for the partial envelope architecture operating at 28 volts. The mere doubling of the supply voltage to 50 volts from 28 volts would ordinarily be expected to yield an increase of 5 dB in power output capability (as was observed). Yet, even when operating from a 50 volt supply, the conventional PA architecture failed to demonstrate 10 watts per device at the critical 30 dB NPR requirement level. In contrast, the partial envelope tracking architecture demonstrated more than 10 watts output at 30 dB NPR even when operating from a much lower supply voltage at 22 volts, as shown in Table 1.

TABLE 2

| FREQUENCY (MHZ) | INPUT | | PA OUTPUT | | |
|---|---|---|---|---|---|
| | PAPR (DB) | NPR (DB) | AVG POWER (DBM/WATTS) | PAPR (DB) | NPR (DB) |
| 1350 | 9.5 | 40.6 | 44.10 | 9.5 | 31.8 |
| 1450 | 9.7 | 39.0 | 44.27 | 9.8 | 32.3 |
| 1550 | 9.4 | 35.3 | 44.15 | 9.1 | 33.2 |
| 1650 | 9.1 | 39.5 | 44.20 | 9.1 | 31.6 |
| 1750 | 9.3 | 37.3 | 43.90 | 9.2 | 32.8 |
| 1850 | 9.1 | 35.02 | 44.18 | 8.9 | 29.4 |

With reference to FIG. 10, a composite radio frequency input waveform 1002 is shown and a radio frequency drive signal 1004 from amplifier 936 is shown. Advantageously, peaks are expanded in signal 1004 and yet low-level signals are not. With reference to FIG. 11, a conventional envelope tracking input signal 1102 and output signal 1106 is shown. Envelope of signals 1102 and 1106 are identical at large amplitudes, but the output envelope of small amplifier 1104 is exaggerated at portion 1108 of signal 1106.

With reference to FIG. 12, a signal 1202 provides an expanded view of envelope tracking compression. The carrier signal wave is distortion-free for small signals but clipping appears at large envelope modulation levels. Gain differential between linear small-signal operation and compressed large-signal operation introduces significant modulation distortion. This gain-differential produces higher modulation-distortion products.

With reference to FIG. 13, unlike conventional envelope tracking schemes, the partial envelope tracking technique supports independent gain adjustments for large amplitude and small amplitude components of signal 1302. Signal 1302

| RF Output Power | | | Supply Power | | | Power Destination | | Efficiency | |
|---|---|---|---|---|---|---|---|---|---|
| Average | Peak | PAPR | Volts | Amps | NPR | Gain | radio | Heat | Drain | PAE |
| Partial-Envelope Tracking Architecture (22-30 volt supply) | | | | | | | | | |
| 40.1 | 47.8 | 7.7 | 22.0 | 1.32 | 30+ | 10.9 | 10.16 | 18.9 | 34.9% | 32.1% |
| 40.0 | 47.8 | 7.7 | 30.0 | 0.98 | 30+ | 10.9 | 10.09 | 19.3 | 34.3% | 31.5% |
| 37.3 | 45.9 | 8.6 | 29.5 | 0.67 | 33.00 | 10.0 | 5.37 | 14.3 | 27.4% | 24.6% |
| 33.8 | 42.0 | 8.2 | 29.5 | 0.51 | 32.00 | 10.0 | 2.40 | 12.7 | 15.9% | 14.3% | is shown in the frequency domain. The partial envelope tracking allows modulation-distortion products to be minimized for signal 1302. In one embodiment, sample data system simulations suggest partial envelope tracking is capable of compliance with the 45 dB ACLR requirement for downlink WCDMA (8 dB PAPR). The simulation exhibits about 50 dB suppression of amplitude distortion products in the adjacent channel and over 65 dB in alternate channel.

In one embodiment, unlike conventional expansion techniques, re-combination of the low-level and high-level signal components introduces no non-linear distortion products to the radio frequency drive signal as the underlying linear processes when superimposed remain linear. When these two radio frequency components are re-combined, the result is an expanded waveform exhibiting higher PAPR than the original input, although distinctly different from the conventional expansion in that expansion characteristic retains inherent band-limited characteristics and is the exact low-pass waveform also being applied to the high-level envelope modulator. The application of asymmetric gain is fundamentally different from pre-distortion techniques which when modulated onto the radio frequency drive signal affect both low-level and high-level radio frequency components in one embodiment.

Figure 14:
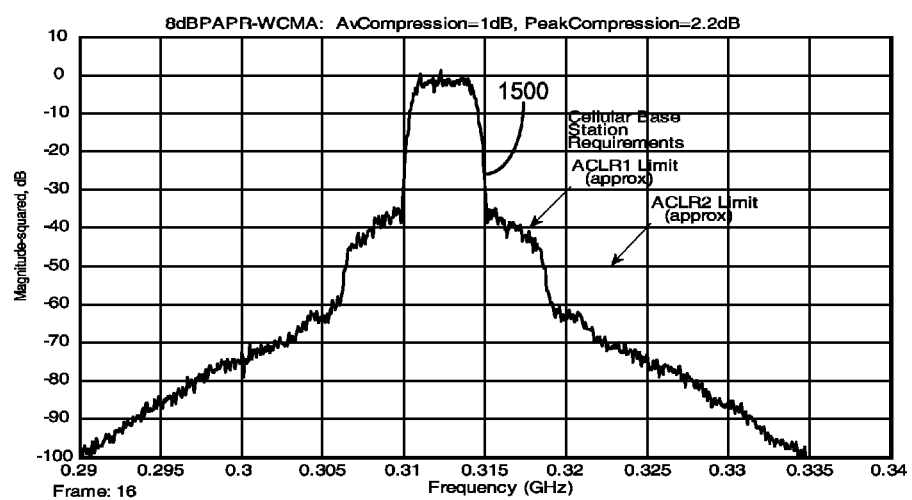
FIG. 14 is a waveform diagram of a signal provided by the system illustrated in FIG. 9. in accordance with an exemplary embodiment.

With reference to FIG. 14, a waveform 1500 in a simulation shows additional simulation against cellular base station spectral mask requirements. Again, spectral containment within the mask is predicted, although the level of allowed compression is reduced. With peak compression over 2 dB an average compression of 1 dB over the entire duration of the waveform, overall efficiency is indicated to remain very high—most probably over 40% and perhaps over 50%. Projections for extremely low broadband noise are particularly encouraging.

Figure 15:
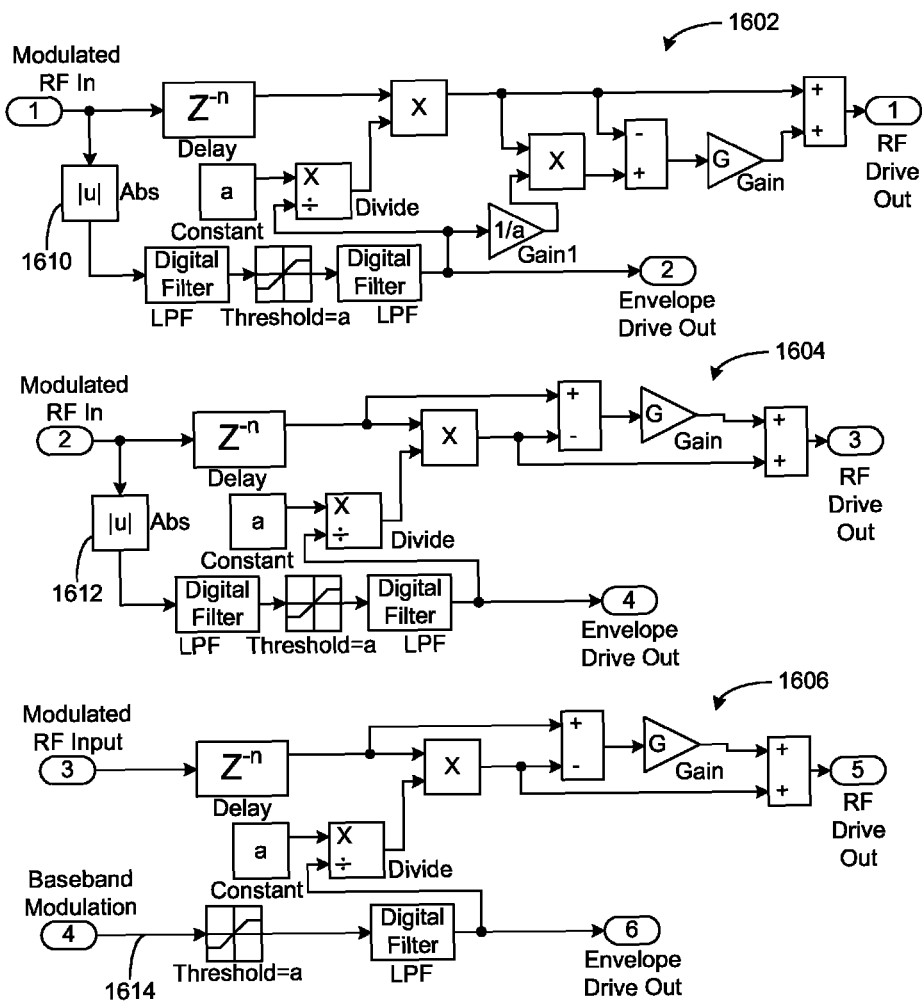
FIG. 15 is a block diagram of three alternative signal processing implementations for the system illustrated in FIG. 9 in accordance with an exemplary embodiment.

With reference to FIG. 15, three block diagram implementations of the partial envelope tracking scheme are shown as diagrams 1602, 1604, and 1606. Diagram 1602 and 1604 can utilize a detector 1610 and 1612. A detector is not needed in implementation 1606 as baseband modulation signals are directly received at input 1614. The present invention is not limited to the specific implementations shown in FIG. 16. Various adjustments can be made without departing from the scope of the invention.

The above embodiments, and other embodiments that may be covered by the Claims, advantageously offer high power-efficiency in broadband power amplifiers operating at multiple frequencies spread across the frequency spectrum and in power amplifiers which must handle wideband waveforms. The final power amplifier stage may be operated well into saturation with the resulting inherent high power-efficiency, but the driver stage and all preceding stages can also be operated at or near compression, allowing relatively high power-efficiency throughout the entire radio frequency chain.

While the detailed drawings, specific examples, detailed algorithms, and particular configurations given describe preferred and exemplary embodiments, they serve the purpose of illustration only. The inventions disclosed are not limited to the specific steps and configurations shown. For example, the methods may be performed in any of a variety of sequence of steps or according to any of a variety of mathematical formulas. The hardware and/or software configurations shown and described may differ depending on the chosen performance characteristics and physical characteristics of the systems and devices used therewith. For example, the type of hardware components and their interconnections may differ. The systems and methods depicted and described are not limited to the precise details and conditions disclosed. The flow charts show preferred exemplary operations only; some of the steps may be optional (e.g., converting step 15 shown in FIG. 1A) or varied. The specific data types, gains and operations are shown in a non-limiting fashion. Furthermore, other substitutions, modifications, changes, and omissions may be made in the design, operating conditions, and arrangement of the exemplary embodiments without departing from the scope of the invention as expressed in the appended claims.

What is claimed is:

1. A system, comprising:
   a first summer for subtracting a residual signal of an input signal from the input signal;
   a second summer for adding a first amplified signal from the first summer and a second amplified signal, the second amplified signal being related to the residual signal, wherein the first amplified signal is amplified with a first gain and the second amplified signal is amplified with a second gain, the first gain being different from the first gain; and
   a power amplifier configured to receive a first sum signal from the second summer, wherein the power amplifier includes a power input receiving a large amplitude component signal related to a separation of the input signal and the residual signal.

2. The system of claim 1, wherein the sum signal is converted to a carrier frequency wherein a broadband range of carrier frequencies for the carrier frequency is between about 1 GHz to 2 GHz.

3. The system of claim 2, wherein the broadband range of carrier frequencies approximates an octave or greater range of frequencies.

4. The system of claim 1, wherein pre-distortion is not added to signals.

5. The system of claim 1, wherein pre-distortion is added to the residual signals.

6. The system of claim 1, wherein the first gain is more than the second gain.

7. The system of claim 1, wherein the first sum signal is converted before being received by the power amplifier.

8. The system of claim 1, wherein the first summer and the second summer are in the digital domain.

9. A system, comprising:
   a first summer for subtracting a residual signal of an input signal from the input signal;
   a second summer for adding a first amplified signal from the first summer and a second amplified signal, the second amplified signal being related to the residual signal, wherein the first amplified signal is amplified with a first gain and the second amplified signal is amplified with a second gain, the first gain being different from the first gain; and
   a power amplifier configured to receive a first sum signal from the second summer, wherein the power amplifier includes a power terminal receiving a large amplitude only component signal related to a separation of the input signal and the residual signal.

10. The system of claim 9, wherein the sum signal is converted to a carrier frequency wherein a broadband range of carrier frequencies for the carrier frequency is between about 1 GHz to 2 GHz.

11. The system of claim 10, wherein the broadband range of carrier frequencies approximates an octave or greater range of frequencies.

12. The system of claim 9, wherein pre-distortion is not added to signals.

13. The system of claim 9, wherein pre-distortion is added to the residual signals.

14. The system of claim 9, wherein the first gain is more than the second gain.

15. The system of claim 9, wherein the first sum signal is converted before being received by the power amplifier.

16. A system, comprising:
- a first summer circuit for subtracting a residual signal of an input signal from the input signal;
- a second summer circuit for adding a first amplified signal from the first summer and a second amplified signal, the second amplified signal being related to the residual signal, wherein the first amplified signal is amplified with a first gain and the second amplified signal is amplified with a second gain, the first gain being different from the first gain; and
- a power amplifier circuit configured to receive a first sum signal from the second summer, wherein the power amplifier includes a power input receiving an amplitude component signal related to a separation of the input signal and the residual signal.

17. The system of claim 16, wherein the sum signal is converted to a carrier frequency wherein a broadband range of carrier frequencies for the carrier frequency is between about 1 GHz to 2 GHz.

18. The system of claim 16, wherein the broadband range of carrier frequencies approximates an octave or greater range of frequencies.

19. The system of claim 16, wherein pre-distortion is not added to signals.

20. The system of claim 16, wherein pre-distortion is added to the residual signals.

21. The system of claim 16, wherein the first gain is more than the second gain.

22. The system of claim 16, wherein the first sum signal is converted before being received by the power amplifier.

23. The system of claim 16, wherein the first summer circuit and the second summer circuit are in a digital domain and the power amplifier is in the analog domain and a digital to analog converter is between the power amplifier and the second summer circuit.

* * * * *